(12) United States Patent
Yoshikawa et al.

(10) Patent No.: US 12,527,151 B2
(45) Date of Patent: Jan. 13, 2026

(54) LIGHT-EMITTING ELEMENT, AND METHOD FOR MANUFACTURING LIGHT-EMITTING ELEMENT

(71) Applicant: SHARP KABUSHIKI KAISHA, Sakai (JP)

(72) Inventors: Hirofumi Yoshikawa, Sakai (JP); Takahiro Doe, Sakai (JP); Masaki Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 410 days.

(21) Appl. No.: 18/028,500

(22) PCT Filed: Sep. 28, 2020

(86) PCT No.: PCT/JP2020/036637
§ 371 (c)(1),
(2) Date: Mar. 24, 2023

(87) PCT Pub. No.: WO2022/064695
PCT Pub. Date: Mar. 31, 2022

(65) Prior Publication Data
US 2023/0337449 A1    Oct. 19, 2023

(51) Int. Cl.
*H10K 50/115* (2023.01)
*H10K 71/15* (2023.01)

(52) U.S. Cl.
CPC .......... *H10K 50/115* (2023.02); *H10K 71/15* (2023.02)

(58) Field of Classification Search
None
See application file for complete search history.

(56) References Cited

U.S. PATENT DOCUMENTS

| | | | |
|---|---|---|---|
| 2010/0108984 A1 | 5/2010 | Cho et al. | |
| 2013/0009131 A1* | 1/2013 | Kazlas | H10K 50/11 257/13 |
| 2021/0371743 A1* | 12/2021 | Liang | H10K 71/40 |
| 2022/0077417 A1* | 3/2022 | Li | H10K 50/16 |

FOREIGN PATENT DOCUMENTS

JP    2010114079 A    5/2010

* cited by examiner

*Primary Examiner* — Anthony Ho
(74) *Attorney, Agent, or Firm* — ScienBiziP, P.C.

(57) ABSTRACT

A light-emitting element includes the following: a first electrode and a second electrode; and a light-emitting layer disposed between the first electrode and the second electrode. The light-emitting layer includes a plurality of quantum dots, and a mixed crystalline body-containing at least one of ZnS or ZnSe and containing $Zn(OH)_2$.

13 Claims, 11 Drawing Sheets

LIGHT-EMITTING ELEMENT, AND METHOD FOR MANUFACTURING LIGHT-EMITTING ELEMENT

TECHNICAL FIELD

The disclosure relates to a light-emitting element that includes quantum dots as a light-emitting material, and to a method for manufacturing the light-emitting element.

BACKGROUND ART

Patent Literature 1 discloses a light-emitting element that includes a light-emitting layer containing quantum dots with organic ligands coordinating with their individual surfaces.

CITATION LIST

Patent Literature

Patent Literature 1: Japanese Unexamined Patent Application Publication No. 2010-114079

SUMMARY OF INVENTION

Technical Problem

In such a light-emitting layer as disclosed in Patent Literature 1 that contains quantum dots with organic ligands coordinating therewith, the efficiency of carrier injection into the quantum dots is low because carriers injected into the light-emitting layer move due to hopping conduction. Further, such carrier movement via organic ligands due to hopping conduction degrades the reliability of quantum dots coordinating with the organic ligands.

Solution to Problem

To solve the above problem, a light-emitting element according to one aspect of the disclosure includes the following: a first electrode and a second electrode; and a light-emitting layer disposed between the first electrode and the second electrode, wherein the light-emitting layer includes a plurality of quantum dots, and a mixed crystalline body containing at least one of ZnS or ZnSe and containing $Zn(OH)_2$.

Further, to solve the above problem, a method for manufacturing a light-emitting element according to another aspect of the disclosure includes the following steps: forming a first electrode; and forming a light-emitting layer by using a plurality of quantum dots, and by using an alkaline aqueous solution containing at least one of a zinc source or a selenium source and containing a sulfur source.

Advantageous Effect of Disclosure

Carrier movement via organic ligands coordinating with quantum dots can be prevented efficiently; thus, the efficiency of carrier injection into the quantum dots can be improved, and the reliability of a light-emitting layer including the quantum dots can be improved.

DESCRIPTION OF EMBODIMENTS

First Embodiment

Summary of Light-Emitting Device

Figure 1:
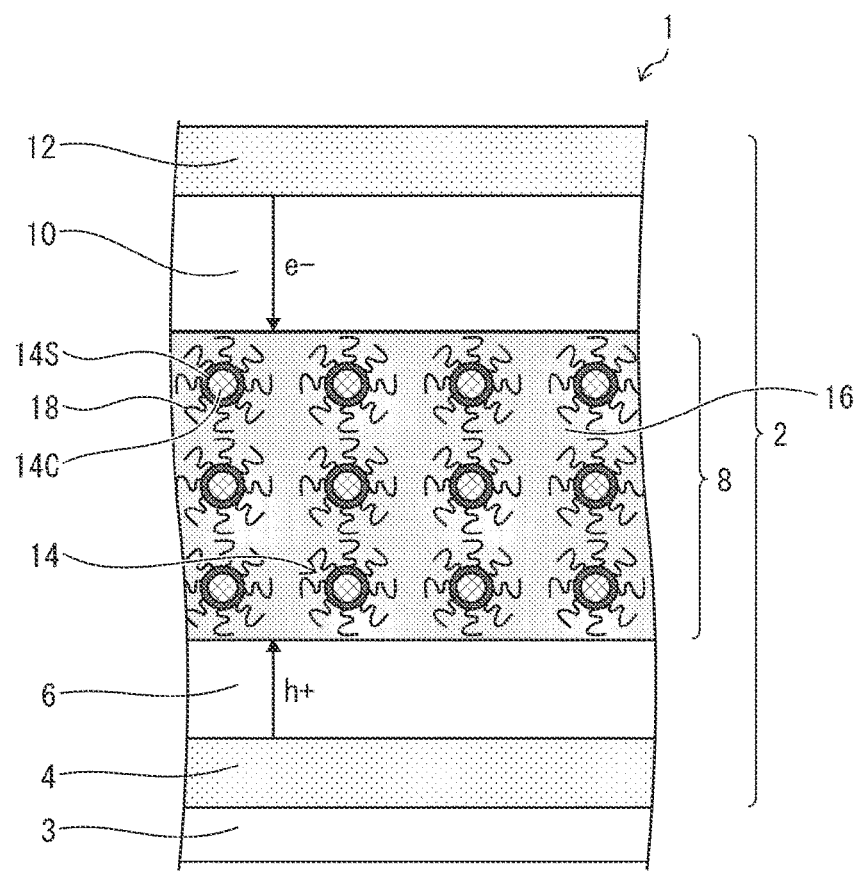
FIG. 1 is a schematic sectional view of a light-emitting device according to a first embodiment of the disclosure.

FIG. 1 is a schematic sectional view of a light-emitting device 1 according to this embodiment. As illustrated in FIG. 1, the light-emitting device 1 according to this embodiment includes a light-emitting element 2 and an array substrate 3. The light-emitting device 1 includes a stack of layers of the light-emitting element 2 on the array substrate 3, on which thin-film transistors (TFTs) not shown are formed. It is noted that the Description describes a direction from the light-emitting element 2 of the light-emitting device 1 toward the array substrate 3 of the same as a downward direction and describes a direction opposite to the downward direction as an upward direction.

The light-emitting element 2 includes the following in the recited order from the bottom on an anode 4, which is a first electrode: a hole transport layer 6, which is a first carrier transport layer; a light-emitting layer 8; an electron transport layer 10, which is a second carrier transport layer; and a cathode 12, which is a second electrode. The anode 4 of the light-emitting element 2, formed over the array substrate 3, is electrically connected to the TFTs of the array substrate 3.

In other words, the light-emitting element 2 includes the anode 4 and the cathode 12 facing each other, and the light-emitting layer 8 between the anode 4 and the cathode 12. Furthermore, the light-emitting element 2 includes the hole transport layer 6 between the anode 4 and the light-emitting layer 8, and the electron transport layer 10 between the cathode 12 and the light-emitting layer 8.

A light-emitting element according to another embodiment may include a cathode over its array substrate as a first electrode. The light-emitting element in this case may include the following in the recited order on the cathode: an electron transport layer, which is a second carrier transport layer; a light-emitting layer; a hole transport layer, which is a first carrier transport layer; and an anode, which is a second electrode.

Summary of Light-Emitting Element

The following further details the configuration of each layer of the light-emitting element 2.

The anode 4 and the cathode 12 contain a conductive material and are electrically connected to the hole transport layer 6 and the electron transport layer 10, respectively.

Either one of the anode 4 and cathode 12 is a transparent electrode. Examples of the transparent electrode include ITO, IZO, ZnO, AZO, BZO and FTO, which may be formed through sputtering or other methods. Further, either one of the anode 4 and cathode 12 may contain a metal material; the metal material is preferably Al, Cu, Au, Ag or Mg alone, all of which have high visible-light reflectance, or one of their alloys.

The hole transport layer 6 is a layer that transports holes from the anode 4 to the light-emitting layer 8. The hole transport layer 6 can be made of an organic or inorganic material that has been conventionally used in, but not limited to, a light-emitting element including quantum dots or an organic EL light-emitting element. A conductive compound, such as CBP, PPV, PEDOT-PSS, TFB or PVK, can be used as the organic material of the hole transport layer 6. A molybdenum oxide and a metal oxide, such as NiO, $Cr_2O_3$, MgO, MgZnO, $LaNiO_3$ or $WO_3$, can be used as the inorganic material of the hole transport layer 6. A material having a large electron affinity and a large ionization potential is particularly suitable for the material of the hole transport layer 6.

The electron transport layer 10 is a layer that transports electrons from the cathode 12 to the light-emitting layer 8. The electron transport layer 10 can be made of $TiO_2$, or an organic or inorganic material that has been conventionally used in, but not limited to, a light-emitting element including quantum dots or an organic EL light-emitting element. A conductive compound, such as Alq3, BCP or t-Bu-PBD, can be used as the organic material of the electron transport layer 10. A metal oxide, such as ZnO, ZAO, ITO, IGZO or electride, can be used as the inorganic material of the electron transport layer 10. A material having a small electron affinity is particularly suitable for the material of the electron transport layer 10.

The hole transport layer 6 and electron transport layer 10 in this embodiment can be formed through vacuum evaporation or sputtering using the foregoing materials, or through application using a colloidal solution. Further, the light-emitting element 2 may include a hole injection layer between the anode 4 and the hole transport layer 6 and may include an electron injection layer between the cathode 12 and the electron transport layer 10. The light-emitting element 2 may furthermore include a middle layer between the hole transport layer 6 and the light-emitting layer 8, or between the electron transport layer 10 and the light-emitting layer 8. These hole injection layer, electron injection layer and middle layer may be all formed through the same process step as the hole transport layer 6 or the electron transport layer 10.

Light-Emitting Layer and Quantum Dot

The light-emitting layer 8 is a layer that includes a plurality of quantum dots (semiconductor nanoparticles). The light-emitting layer 8 in this embodiment particularly includes a plurality of quantum dots 14 and a mixed crystalline body 16. The light-emitting layer 8 may also include ligands 18 coordinating with the individual quantum dots 14.

Figure 2:
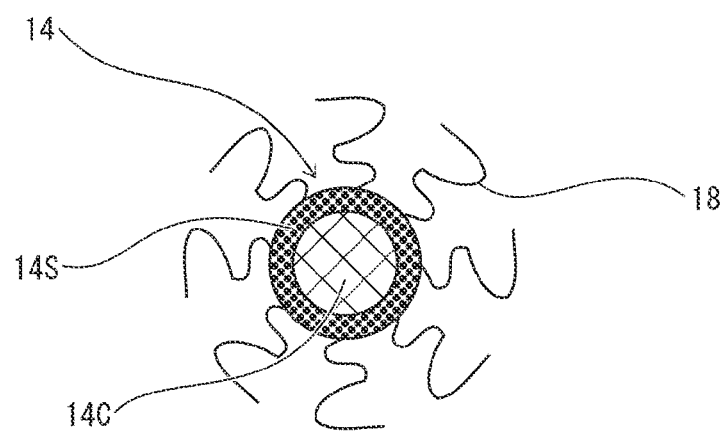
FIG. 2 is a schematic enlarged view of a quantum dot according to the first embodiment of the disclosure.

The quantum dots 14 and ligands 18, included in the light-emitting layer 8 according to this embodiment, will be described with reference to FIG. 2. FIG. 2 is a schematic sectional view of a quantum dot 14 along with ligands 18.

The quantum dots 14 in this embodiment are each a quantum dot of core-shell structure that includes a core 14C and a shell 14S formed around the core 14C. Recombination of an electron and hole injected into the quantum dot 14 occurs mainly in the core 14C in this embodiment. The shell 14S has the function of preventing, but not limited to, a defect or dangling-bond of the core 14C, and of reducing carrier recombination that goes through a deactivation process.

The quantum dot 14 may contain, as the materials of the respective core 14C and shell 14S, materials that are used as a core member and a shell member of a quantum dot having a conventionally publicly known core-shell.

The material of the shell 14S in this embodiment contains $ZnS_xSe_{1-x}$ for instance, where $0 \leq x \leq 1$ is satisfied. To be specific, the quantum dot 14 may be, for instance, a Cd-based semiconductor nanoparticle that includes the core 14C of CdSe and the shell 14S of ZnS. Alternatively, the quantum dot 14 may be, for instance, a Cd-based semiconductor nanoparticle that includes the core 14C of CdSe and the shell 14S of ZnSe.

Other than the foregoing, the quantum dot 14 may have CdSe—CdS, InP—ZnS, ZnSe—ZnS, CIGS-ZnS, or other combinations as its core-shell structure. It is noted that that shell 14S may be formed of a plurality of layers that contain a plurality of respective materials different from each other.

The core 14C of the quantum dot 14 is a light-emitting material that has a valence band level and a conduction band level, and that emits light upon recombination of a hole of the valence band level and an electron of the conduction band level. Light emitted from the quantum dot 14 has a narrow spectrum due to a quantum confinement effect, thus enabling light emission of relatively deep chromaticity to be obtained.

Here, the quantum dots 14 in the light-emitting layer 8 do not have to be arranged such an orderly manner as illustrated in FIG. 1; the quantum dots 14 may be included in the light-emitting layer 8 disorderly. It is noted that the light-emitting layer 8 may have a thickness of about 1 to 100 nm.

The quantum dots 14 have a particle diameter of about 1 to 100 nm. The wavelength of light emitted from the quantum dots 14 can be controlled by their particle diameters. In particular, since the quantum dots 14 have a core-shell structure, controlling the particle diameters of the cores 14C can control the wavelength of light emitted from the quantum dots 14. Thus, controlling the particle diameters of the cores 14C of the quantum dots 14 can control the wavelength of light emitted from the light-emitting device 1.

The ligands 18 coordinate with the shell 14S of each quantum dot 14. The ligands 18 may be ligands that contain an organic substance and that are typically used as ligands of a quantum dot. The ligands 18 each have, for instance, an organic long chain with carbon hydrogen atoms bonding together, and a modified functional group positioned at one end of the organic long chain, coordinating with the shell 14S and including an amino group or a thiol group.

The ligands 18 have the function of preventing, but not limited to, a defect or dangling-bond of the shell 14S. Other than the foregoing, the ligands 18 achieve the following effects: reduction in the agglomeration of quantum dots with which they coordinate: protection from the surrounding environment of the quantum dots; offering of electricity stability on the surfaces of the quantum dots; improvement in the solubility or dispersibility of a solvent of the quantum dots; or the others.

However, the light-emitting layer 8 in this embodiment does not have to include the ligands 18. Further, the ligands 18 in this embodiment may coordinate with only the shells 14S of some of the quantum dots 14 within the light-emitting layer 8. The ligands 18 do not coordinate with at least some of the quantum dots 14 included in the light-emitting layer 8, thereby more efficiently causing carrier movement via the inorganic substance within the light-emitting layer 8. This can improve the efficiency of carrier injection into the quantum dots 14 and can improve the reliability of the light-emitting layer 8 including the quantum dots 14.

Mixed Crystalline Body

Referring back to FIG. 1, the mixed crystalline body 16 in this embodiment is a mixed crystalline body that is formed of a solid solution of at least one of zinc sulfide (ZnS) or zinc selenide (ZnSe), and of zinc hydroxide ($Zn(OH)_2$). In other words, the mixed crystalline body 16 is formed of at least one of a ZnS-containing crystal having Zn—S bonding or a ZnSe-containing crystal having Zn—Se bonding, and of a $Zn(OH)_2$-containing mixed crystal having Zn—OH bonding. In other words furthermore, the mixed crystalline body 16 contains $ZnS_xSe_{1-x}$ mainly, where $0 \le x \le 1$, and further contains $Zn(OH)_2$ having Zn—OH bonding. It is noted that the mixed crystalline body 16 may further contain ZnO having Zn—O bonding. The mixed crystalline body 16 may be formed so as to fill at least some of the gaps between the quantum dots 14 in the light-emitting layer 8. In other words, the quantum dots 14 may be embedded in the mixed crystalline body 16.

Summary of Method for Manufacturing Light-Emitting Device

Figure 3:
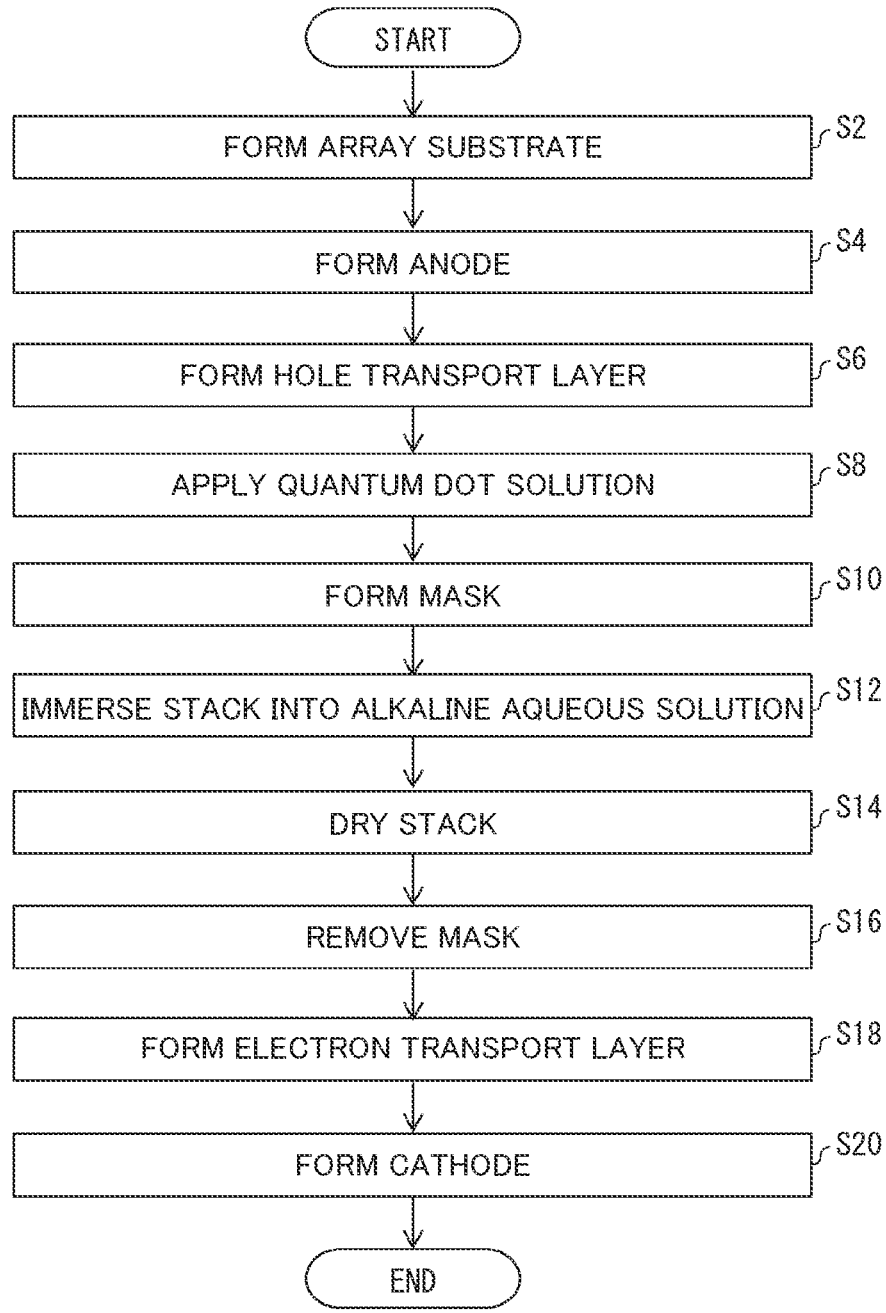
FIG. 3 is a flowchart showing a method for manufacturing the light-emitting device according to the first embodiment of the disclosure.

A method for manufacturing the light-emitting device 1 according to this embodiment will be described with reference to FIG. 3. FIG. 3 is a flowchart showing the method for manufacturing the light-emitting device 1 according to this embodiment.

The method for manufacturing the light-emitting device 1 according to this embodiment includes firstly forming the array substrate 3 (Step S2). The formation of the array substrate 3 may be performed by forming TFTs onto a glass substrate in correspondence with a location for forming the anode 4 of the light-emitting element 2.

The next (Step S4) is forming the anode 4. The anode 4 may be formed by, for instance, forming a film of conductive material through sputtering or other methods, as described above. The next (Step S6) is forming the hole transport layer 6. The hole transport layer 6 may be formed through, for instance, vacuum evaporation, sputtering, application using a colloidal solution or other methods, as described above.

Step of Forming Light-Emitting Layer

The next is performing a step of forming the light-emitting layer 8. The step of forming the light-emitting layer 8 includes firstly applying a quantum dot solution (Step S8) with the quantum dots 14 dispersed onto the hole transport layer 6 to thus form a quantum dot layer with a plurality of quantum dots 14 stacked onto the hole transport layer 6. Step S8 may use a solvent that typically disperses quantum dots, such as toluene, hexane or octane, as a solvent that disperses the quantum dots 14.

It is noted that the quantum dot solution with the quantum dots 14 dispersed may contain the ligands 18 coordinating with the individual quantum dots 14. Accordingly, at least some of the ligands 18 contained in the quantum dot solution coordinate with the quantum dots 14, and by extension, the dispersibility of the quantum dots 14 in the quantum dot solution improves.

Here, when the quantum dot solution contains the ligands 18, a step of replacing the solvent of the quantum dot solution with the quantum dots 14 dispersed one or more times may be performed in this embodiment before Step S8 is performed. Alternatively, the quantum dot solution according to this embodiment may be a solution with the quantum dots 14 dispersed within an excessive amount of solvent. In the quantum dot solution containing the quantum dots 14 and ligands 18, the ligands 18 coordinating with the quantum dots 14 and the ligands 18 dispersed within the solvent without coordinating are in equilibrium. Hence, replacing the solvent of the quantum dot solution or dispersing the quantum dots 14 into an excessive amount of solvent lowers the concentration of the ligands 18 dispersed within the solvent and, by extension, lowers the concentration of the ligands 18 coordinating with the quantum dots 14. As such, replacing the solvent of the quantum dot solution or dispersing the quantum dots 14 into an excessive amount of solvent can efficiently reduce the number of ligands 18 that coordinate with a single quantum dot 14.

It is noted that the foregoing has described a non-limiting method of applying a quantum dot solution with the quantum dots 14 dispersed, as a method of forming a quantum dot layer containing the quantum dots 14. The quantum dot layer may be formed by, for instance, depositing the quantum dots 14 onto the hole transport layer 6 through ion beam deposition.

To be specific, the quantum dot layer may be formed by ionizing the quantum dots 14 through electrospray and by radiating the ionized quantum dots 14 toward the upper layer of the hole transport layer 6 with an acceleration mechanism using free jet, to thus deposit the quantum dots 14. In this case, the ionized quantum dots 14 enable the ligands 18 coordinating with the quantum dots 14 to be left when impacting onto the hole transport layer 6. This can efficiently reduce the number of ligands 18 that coordinate with a single quantum dot 14.

The next is forming the mixed crystalline body 16 onto the perimeter surfaces of the quantum dots 14 included in the quantum dot layer formed in Step S8, by growing a crystal contained in the mixed crystalline body 16. The step of forming the mixed crystalline body 16 will be described with reference to the sectional view in FIG. 4.

Figure 4:
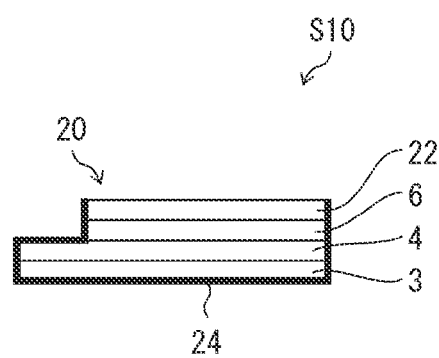
FIG. 4 illustrates, in a sectional view, a part of a step of forming a light-emitting layer in the method for manufacturing the light-emitting device according to the first embodiment of the disclosure.
Figure 4:
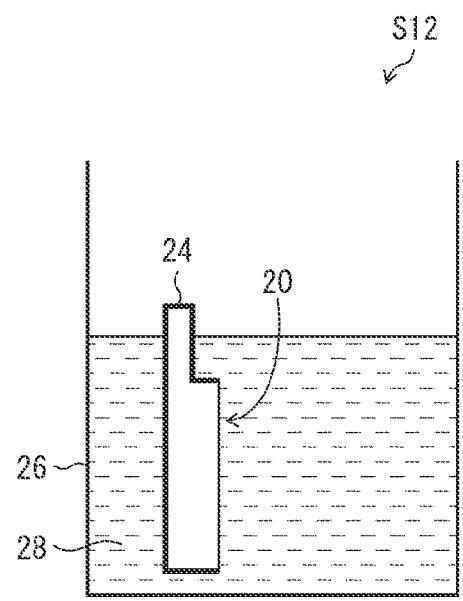

A stack 20 illustrated in FIG. 4 has been formed at the time of the completion of Step S8. The stack 20 includes the anode 4, the hole transport layer 6, and a quantum dot layer 22 stacked in this order on the array substrate 3. The step of forming the mixed crystalline body 16 includes firstly forming a mask 24 (Step S10) onto a part of the outer surface of the stack 20. To be specific, the mask 24 is formed onto the side surface of each layer of the stack 20 and the lower surface of the array substrate 3, as shown in Step S10 in FIG. 4. Accordingly, only a part of the outer surface of the stack 20 including the upper surface of the quantum dot layer 22 is exposed from the mask 24.

The next (Step S12) is immersing the stack 20 with a part of its outer surface including the upper surface of the quantum dot layer 22 being exposed into a reaction solution 28 within a reaction container 26. An alkaline aqueous solution containing at least one of a zinc source or a selenium source, and containing a sulfur source is used as the reaction solution 28. The mixed crystalline body 16 is thus formed in the gaps between the quantum dots 14 of the quantum dot layer 22.

Step of Forming Mixed Crystalline Body through CBD

Step S12 will be further detailed. In forming the mixed crystalline body 16, Step S12 uses chemical bath deposition (CBD) using, as the reaction solution 28, an alkaline aqueous solution containing at least one of a zinc source or a selenium source and containing a sulfur source. Step S12 includes synthesizing ZnS or ZnSe within the alkaline aqueous solution to thus form a part of the crystal of the mixed crystalline body 16. The mixed crystalline body 16 thus definitely contains at least a hydroxy group (—OH group) between the hydroxy group (—OH group) and an oxygen group (—O group). It is noted that $Zn(OH)_2$ is not normally mixed intentionally when a film of ZnS, ZnSe or ZnO is formed through vacuum or evaporation.

The sum value of a zinc ion concentration and a selenium ion concentration within the reaction solution 28 is desirably 0.001 mol/L or greater and is more desirably 0.01 mol/L or greater. Setting the sum value of the zinc ion concentration and selenium ion concentration within the reaction solution 28 at 0.001 mol/L or greater can sufficiently reduce the time for forming the mixed crystalline body 16.

In contrast, the sum value of the zinc ion concentration and selenium ion concentration within the reaction solution 28 is desirably 0.5 mol/L or smaller and is more desirably 0.1 mol/L or smaller. Setting the sum value of the zinc ion concentration and selenium ion concentration within the reaction solution 28 0.5 mol/L or smaller can avoid a deterioration in the controllability of forming the mixed crystalline body 16 that results from an extreme reduction in the time for forming the mixed crystalline body 16. This configuration can also avoid a deterioration in the yield of the mixed crystalline body 16 with respect to the materials within the reaction solution 28 and can thus reduce costs.

Further, the concentration of sulfide ions within the reaction solution 28 is desirably 0.5 times or greater of the sum value of the zinc ion concentration and selenium ion concentration and is more desirably 1 time or greater of the same. Setting the sulfide ion concentration within the reaction solution 28 at 0.5 times or greater of the sum value of the zinc ion concentration and selenium ion concentration avoids Zn—O bonding from becoming predominant in the mixed crystalline body 16 and, by extension, avoids Zn—S bonding from being established in the mixed crystalline body 16.

In contrast, the concentration of the sulfide ions within the reaction solution 28 is desirably 0.5 times or smaller of the sum value of the zinc ion concentration and selenium ion concentration and is more desirably 3 times or smaller of the same. Setting the sulfide ion concentration within the reaction solution 28 at 5 times or smaller of the sum value of the zinc ion concentration and selenium ion concentration can avoid excess S atoms from being introduced into a ZnS crystal or a ZnSe crystal as acceptors. As a result, the ZnS crystal or the ZnSe crystal can be avoided from behaving like a p-type semiconductor within the mixed crystalline body 16, and thus, a reduction in carrier transporting efficiency in the light-emitting layer 8 can be avoided.

Further, the sum value of the zinc ion concentration and selenium ion concentration within the reaction solution 28 is preferably smaller than the sulfide ion concentration within the reaction solution 28. This can offer Zn—S bonding as a principal component with regard to the crystalline bonding of the mixed crystalline body 16 and, by extension, can render the molar concentration of ZnS or ZnSe in the mixed crystalline body 16 higher than the molar concentration of $Zn(OH)_2$ efficiently.

It is noted that the zinc source contained in the reaction solution 28 includes at least one of, for instance, zincate, zinc sulfate, zinc nitrate or zinc acetate. Further, the sulfur source contained in the reaction solution 28 includes at least one of, for instance, sulfur, water-soluble thiol, water-soluble thiourea or a water-soluble thiocarbonyl compound.

Further, the reaction solution 28 undergoes temperature rise to 60 to 90° C. inclusive desirably and to 70 to 80° C. more desirably during the crystal growth in the mixed crystalline body 16.

Step S12 is followed by taking the stack 20 out of the reaction solution 28 and drying the stack 20 (Step S14). Step S14 is performed by drying the stack 20 for, for instance, an hour at room temperature. After that, removing the mask 24 from the stack 20 (Step S16) to thus complete the step of forming the mixed crystalline body 16. The step of forming the mixed crystalline body 16 is completed, thus completing the step of forming the light-emitting layer 8 including the quantum dots 14 and the mixed crystalline body 16.

The next (Step S18) is forming the electron transport layer 10. The electron transport layer 10 may be formed through, for instance, vacuum evaporation, sputtering, application using a colloidal solution or other methods, as described above. The next (Step S20) is forming the cathode 12. The cathode 12 may be formed by, for instance, forming a film of conductive material through sputtering or other methods, as described above.

The light-emitting element 2 according to this embodiment is formed through the foregoing, and the process steps for manufacturing the light-emitting device 1 are completed. It is noted that the method for manufacturing the light-emitting device 1 according to this embodiment may include a step of forming the earlier described hole injection layer, electron injection layer and middle layer. Furthermore, Step S20 may be followed by forming a capping layer and other things onto the light-emitting element 2 by forming the capping layer and other things onto the cathode 12.

As described above, forming the mixed crystalline body 16 by performing a step of forming a mixed crystalline body through CBD offers four advantages listed below.

(1) The step of forming the mixed crystalline body enables the quantum dots 14 to be embedded into the mixed crystalline body 16 that has a high surface coating capability, thus preventing cavities in the light-emitting layer 8. This prevents carrier concentration on a part of the light-emitting layer 8 at the time of carrier injection into the light-emitting layer 8, and an improvement in the lifetime of the light-emitting element 2 is promising.

(2) The mixed crystalline body 16 undergoes etching due to an alkaline aqueous solution, at the early stage of growing of the mixed crystalline body 16 in the step of forming the mixed crystalline body. Hence, the step of forming the mixed crystalline body enables the mixed crystalline body 16 that is clean as well as the interface between the quantum dot 14 that is clean and the mixed crystalline body 16 to be obtained easily.

(3) The step of forming the mixed crystalline body through CBD, which is a low-temperature process of growing the mixed crystalline body 16 within an alkaline aqueous solution, can prevent thermal damage to the quantum dots 14.

(4) A group II-VI semiconductor of, but not limited to, ZnS or ZnSe formed through CBD can prevent defect formation that results from removal of the group VI element, in other words, removal of a S atom or Se atom, from the group II-VI semiconductor that is formed through a conventional method. A defect in a group II-VI semiconductor that has a strong ion bonding capability is known as establishing a deep level, which constitutes a carrier trap in some cases. A ZnS film through CBD can, in the process of generation, compensate for removal of a group VI element by using its Zn—OH bonding to thus prevent defect formation and can deactivate a deep-level carrier trap, which is difficult to avoid in the other film formation methods.

A defect formed within the light-emitting layer 8 causes each carrier, in other words, an electron or a hole, injected from the electron transport layer 10 or hole transport layer 6 to be trapped. Hence, using the mixed crystalline body 16 formed through CBD for the light-emitting layer 8, which leads to a reduction in defect generation that can be a carrier trap in the mixed crystalline body 16, contributes to an improvement in the efficiency of carrier injection into the light-emitting layer 8.

Summary of First Embodiment

The light-emitting element 2 according to this embodiment includes the plurality of quantum dots 14, and the mixed crystalline body 16 containing at least one of ZnS or ZnSe. Thus, at least some of electrons and holes injected into the light-emitting layer 8 move via the inorganic substance included in the mixed crystalline body 16 and containing ZnS or ZnSe. Hence, carrier movement in the light-emitting layer 8 through hopping conduction reduces, thus improving the efficiency of carrier injection into the light-emitting layer 8, and improving the reliability of the light-emitting layer 8. The light-emitting element 2 according to this embodiment consequently improves the light emission efficiency and reliability of the light-emitting device 1 including the light-emitting element 2.

The molar concentration of at least one of ZnS or ZnSe in the light-emitting layer 8 is higher than the molar concentration of $Zn(OH)_2$ in this embodiment. This configuration causes electrons and holes injected into the light-emitting layer 8 to move via the inorganic substance of the mixed crystalline body 16 more efficiently.

The shells 14S of the quantum dots 14 and the inorganic substance contained in the mixed crystalline body 16 may have the same composition in view of the step of forming the mixed crystalline body 16 through CBD in Step S12. In this case, the mixed crystalline body 16 undergoes crystalline growth more efficiently on the outer surfaces of the shells 14S. The foregoing configuration enables the mixed crystalline body 16 to be formed more accurately, thus improving carrier transport efficiency in the light-emitting layer 8. Further, the discontinuity of the band lineup between the shells 14S and the mixed crystalline body 16 is smaller than that of the band lineup between the shells 14S and the ligands 18 when the shells 14S of the quantum dots 14 and the inorganic substance contained in the mixed crystalline body 16 are of the same composition. The foregoing configuration prevents the discontinuity of the band lineup between the mixed crystalline body 16 and the shells 14S, thus enabling efficient carrier transport from the mixed crystalline body 16 to the shells 14S.

It is noted that the crystals of the shells 14S of the quantum dots 14 can be distinguished from the crystal of the inorganic substance contained in the mixed crystalline body 16 even when the shells 14S of the quantum dots 14 and the inorganic substance contained in the mixed crystalline body 16 have the same composition. The shells 14S of the quantum dots 14 can be distinguished from the inorganic substance contained in the mixed crystalline body 16 by, for instance, cutting out the light-emitting layer 8 in cross section and observing this cross section with a transmission electron microscope (TEM) or other things.

To be specific, observing the cross section of the light-emitting layer 8 can confirm that the interfaces of the shells 14S of the quantum dots 14 have a shape that is along the perimeter surfaces of the cores 14C. In contrast, the interface of the mixed crystalline body 16 is observed in a location different from that of the shape that is along the perimeter surfaces of the cores 14C. Many crystal interfaces of the mixed crystalline body 16 are observed particularly in the cross section of the light-emitting layer 8 because the crystal of the mixed crystalline body 16 in this embodiment is formed on a surface having asperities formed by the outer surfaces of the quantum dots 14.

As such, observing the interface of the crystal within the light-emitting layer 8 in the cross section of the light-emitting layer 8 can distinguish the crystals of the shells 14S of the quantum dots 14 from the crystal of the inorganic substance contained in the mixed crystalline body 16.

Second Embodiment

Color Light-Emitting Device

Figure 5:
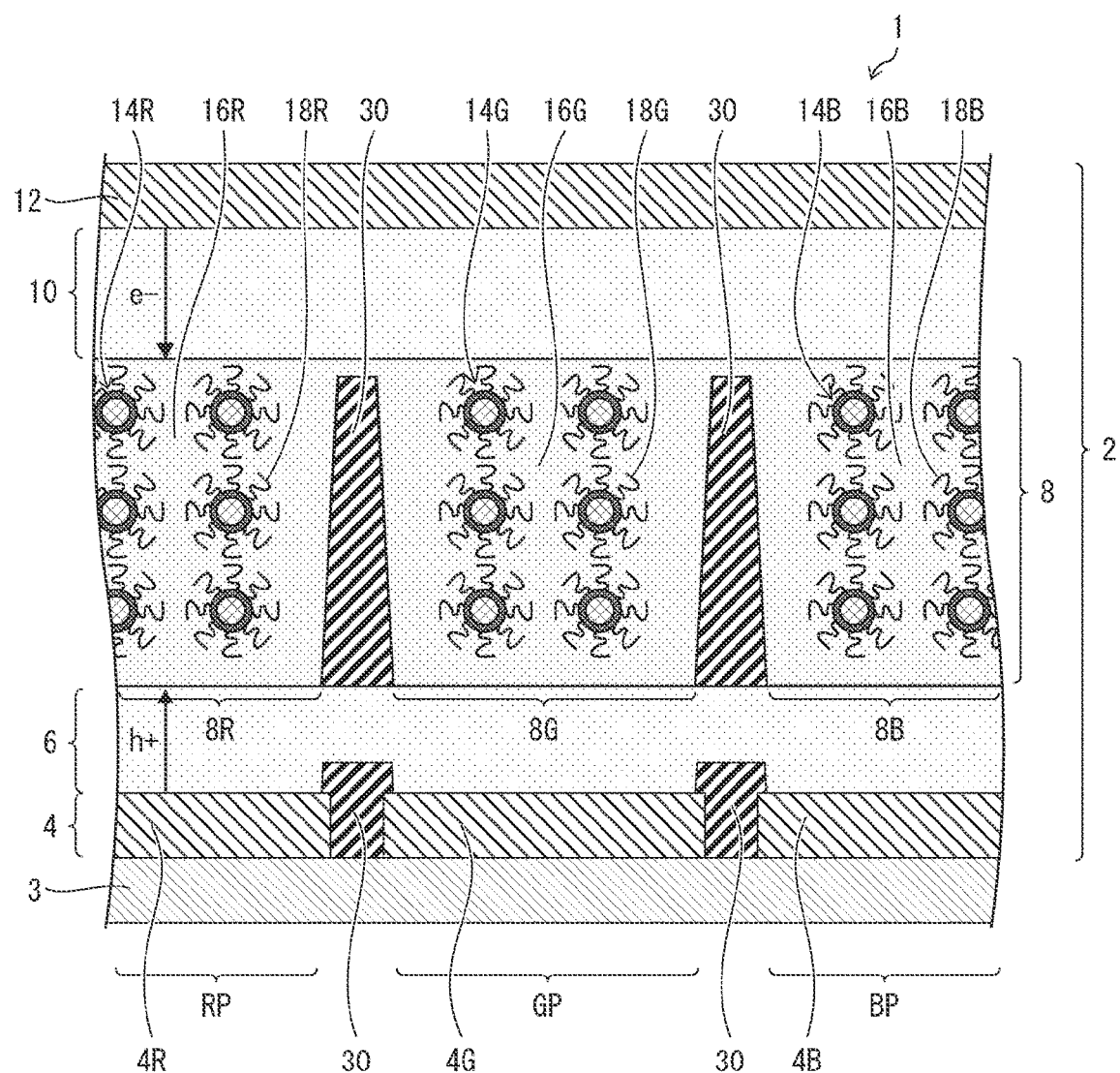
FIG. 5 is a schematic sectional view of a light-emitting device according to a second embodiment of the disclosure.

FIG. 5 is a schematic sectional view of the light-emitting device 1 according to this embodiment. The light-emitting device 1 according to this embodiment is different from the light-emitting element 2 according to the foregoing embodiment in that a red subpixel RP, a green subpixel GP, and a blue subpixel BP are provided.

The light-emitting element 2, like the light-emitting element 2 according to the foregoing embodiment, includes the hole transport layer 6, the light-emitting layer 8, the electron transport layer 10, and the cathode 12 in this order from the bottom on the anode 4. Here, each of the anode 4 and light-emitting layer 8 in this embodiment is separated by a bank 30.

In particular, the anode 4 in this embodiment is separated into an anode 4R, an anode 4G, and an anode 4B by the bank 30. Further, the light-emitting layer 8 is separated into a red light-emitting layer 8R, a green light-emitting layer 8G, and a blue light-emitting layer 8B by the back 30. It is noted that the hole transport layer 6, the electron transport layer 10, and the cathode 12 are not separated by the bank 30 and are formed in common. The bank 30 separating the anode 4 may be formed in a location covering the side surface of the anode 4 and the vicinity of the peripheral end of the upper surface of the same, as illustrated in FIG. 5.

Further, the light-emitting element 2 according to this embodiment is configured such that the red subpixel RP is formed by the anode 4R, a hole transport layer 6R and the red light-emitting layer 8R, which are in the form of an island, and by the electron transport layer 10 and the cathode 12, which are common. Likewise, the green subpixel GP is formed by the anode 4G, a hole transport layer 6G and the green light-emitting layer 8G, which are in the form of an island, and by the electron transport layer 10 and the cathode 12, which are common. Likewise, the blue subpixel BP is formed by the anode 4B, a hole transport layer 6B and the blue light-emitting layer 8B, which are in the form of an island, and by the electron transport layer 10 and the cathode 12, which are common.

In this embodiment, the red light-emitting layer 8R, included in the red subpixel RP, emits red light, the green light-emitting layer 8G, included in the green subpixel GP, emits green light, and the blue light-emitting layer 8B, included in the blue subpixel BP, emits blue light. That is, the light-emitting element 2 includes a plurality of subpixels for each light emission wavelength of the light-emitting layer 8 and includes the anode 4, the hole transport layer 6, and the light-emitting layer 8 for each subpixel. It is noted that the light-emitting element 2 includes the electron transport layer 10 and the cathode 12 in common throughout all the subpixels.

Here, blue light is light that has a light-emission central wavelength in a wavelength band of 400 to 500 nm inclusive for instance. Further, green light is light that has a light-emission central wavelength in a wavelength band of over 500 nm and 600 nm or smaller for instance. Further, red light is light that has a light-emission central wavelength in a wavelength band of over 600 nm and 780 nm or smaller for instance.

The light-emitting device 1 according to this embodiment may be configured such that a group that includes a single red subpixel RP, a single green subpixel GP and a single subpixel BP of the light-emitting element 2 constitutes a single pixel in the light-emitting device 1. Further, although FIG. 5 illustrates only one pixel, the light-emitting device 1 in this embodiment may include a plurality of pixels other than the illustrated one.

The individual layers of the light-emitting element 2 according to this embodiment but the light-emitting layer 8 may be made of the same material as the respective layers of the light-emitting element 2 according to the foregoing embodiment. The red light-emitting layer 8R in this embodiment includes red quantum dots 14R, a mixed crystalline body 16R, and ligands 18R. Further, the green light-emitting layer 8G includes green quantum dots14G, a mixed crystalline body 16G, and ligands 18G. Furthermore, the blue light-emitting layer 8B includes blue quantum dots 14B, a mixed crystalline body 16B, and ligands 18B.

The individual quantum dots included in the light-emitting layer 8 may be each a quantum dot of core-shell structure that includes the foregoing core 14C and shell 14S. The cores 14C of the quantum dots included in the light-emitting layer 8 of each pixel have their particle diameters that are different from each other in accordance with the color of emitted light. A quantum dot having a core-shell structure is typically configured such that the wavelength of mainly emitted light is proportional to the core's particle diameter. Thus, controlling the particle diameters of the cores 14C of the quantum dots included in the light-emitting layer 8 of each pixel can regulate the color of light emitted from each light-emitting layer 8.

The mixed crystalline body 16 and ligands 18 according to this embodiment contain the respective materials of the mixed crystalline body 16 and ligands 18 in the foregoing embodiment. Here, the mixed crystalline body 16 and ligands 18 included in the light-emitting layer 8 in each subpixel may be made of the same material or mutually different materials between the subpixels.

Method for Manufacturing Light-Emitting Device According to Second Embodiment

Figure 6:
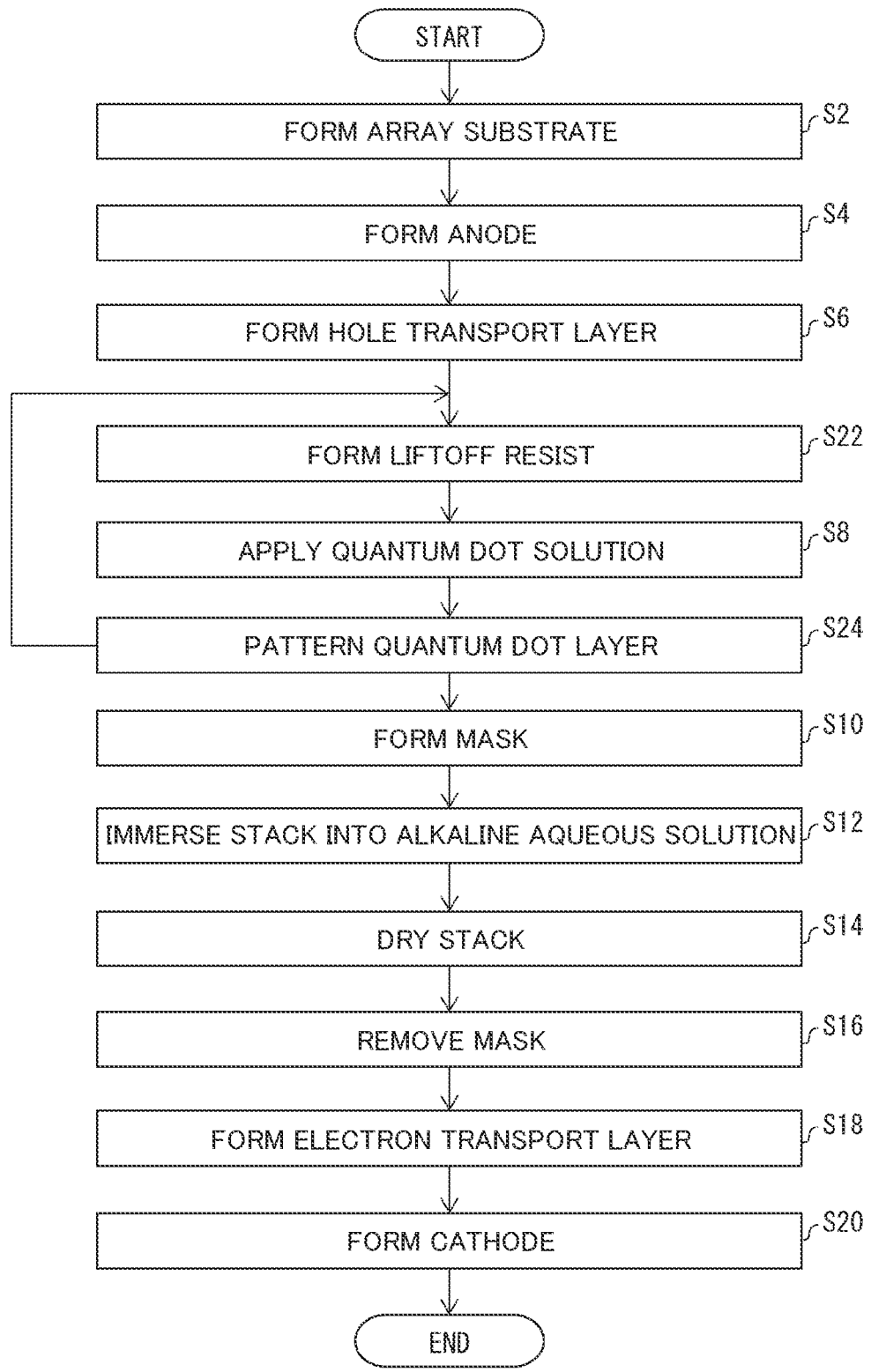
FIG. 6 is a flowchart showing a method for manufacturing the light-emitting device according to the second embodiment of the disclosure.

A method for manufacturing the light-emitting device 1 according to this embodiment will be described with reference to FIG. 6. FIG. 6 is a flowchart showing the method for manufacturing the light-emitting device 1 according to this embodiment.

The method for manufacturing the light-emitting device 1 according to this embodiment includes foregoing Step S2 through Step S6, which are performed firstly. Here, Step S2 may include forming TFTs, which drive the respective subpixels, onto the array substrate 3. Further, Step S4 includes forming the anode 4 in the form of an island in each subpixel. Furthermore, Step S6 includes forming, before forming the hole transport layer 6, the banks 30 in locations covering the ends of the respective anodes 4. Step S6 also includes forming, after forming the hole transport layer 6, the banks 30 for separating the light-emitting layer 8. The banks 30 may be formed by, for instance, applying a material containing photosensitive resin, followed by patterning the material through photolithography.

Liftoff Method

The next is performing a step of forming the light-emitting layer 8. The step of forming the light-emitting layer 8 according to this embodiment will be further detailed with reference to FIG. 7 to FIG. 10. FIG. 7 to FIG. 10 illustrate, in a sectional view, the step of forming the light-emitting layer 8 according to this embodiment and each illustrate a cross section corresponding to the cross section in FIG. 5. It is noted that FIG. 7 to FIG. 10 illustrate an example method of forming the red light-emitting layer 8R.

Figure 7:
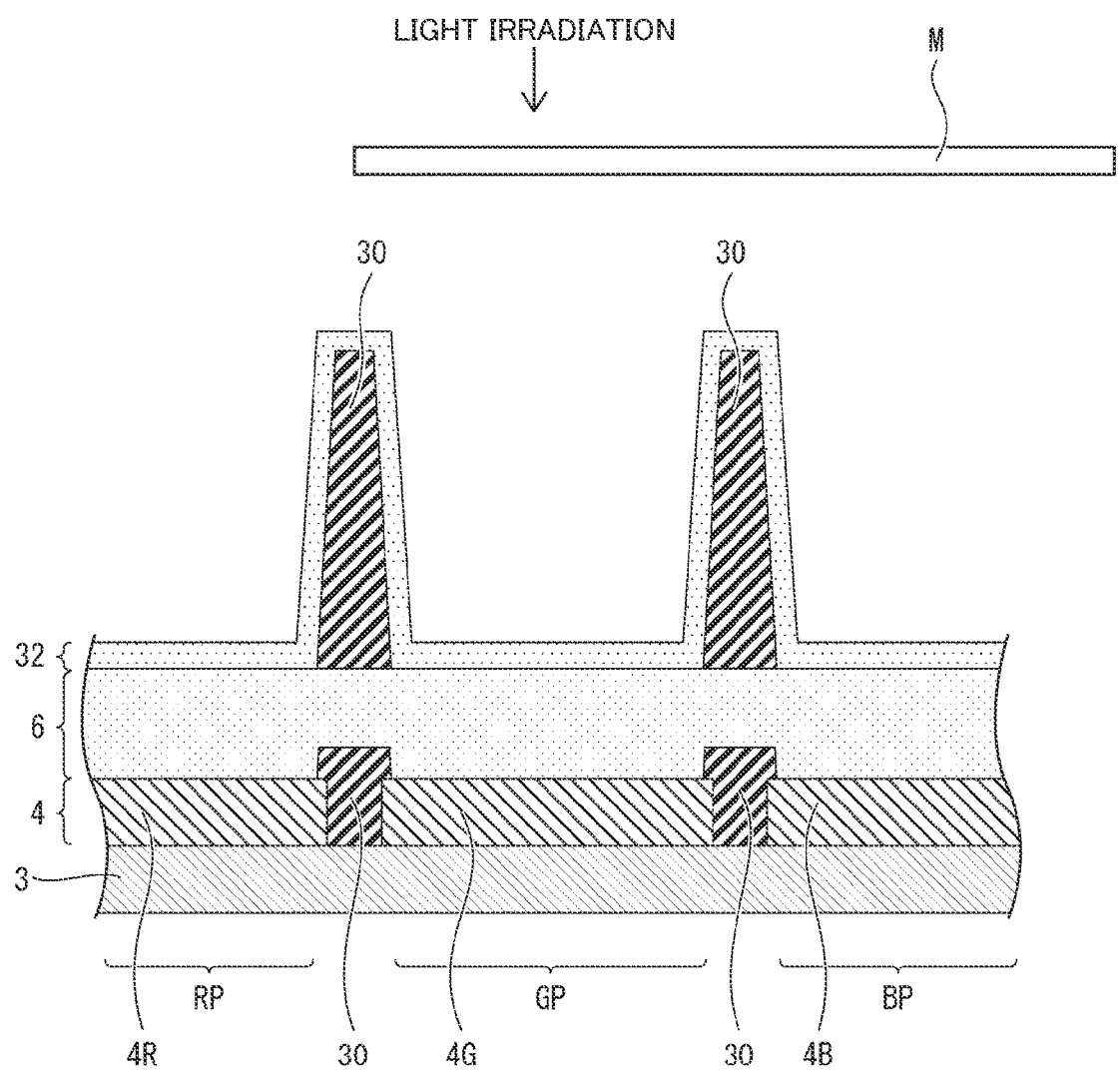
FIG. 7 illustrates, in a sectional view, a process step in the method for manufacturing the light-emitting device according to the second embodiment of the disclosure.
Figure 8:
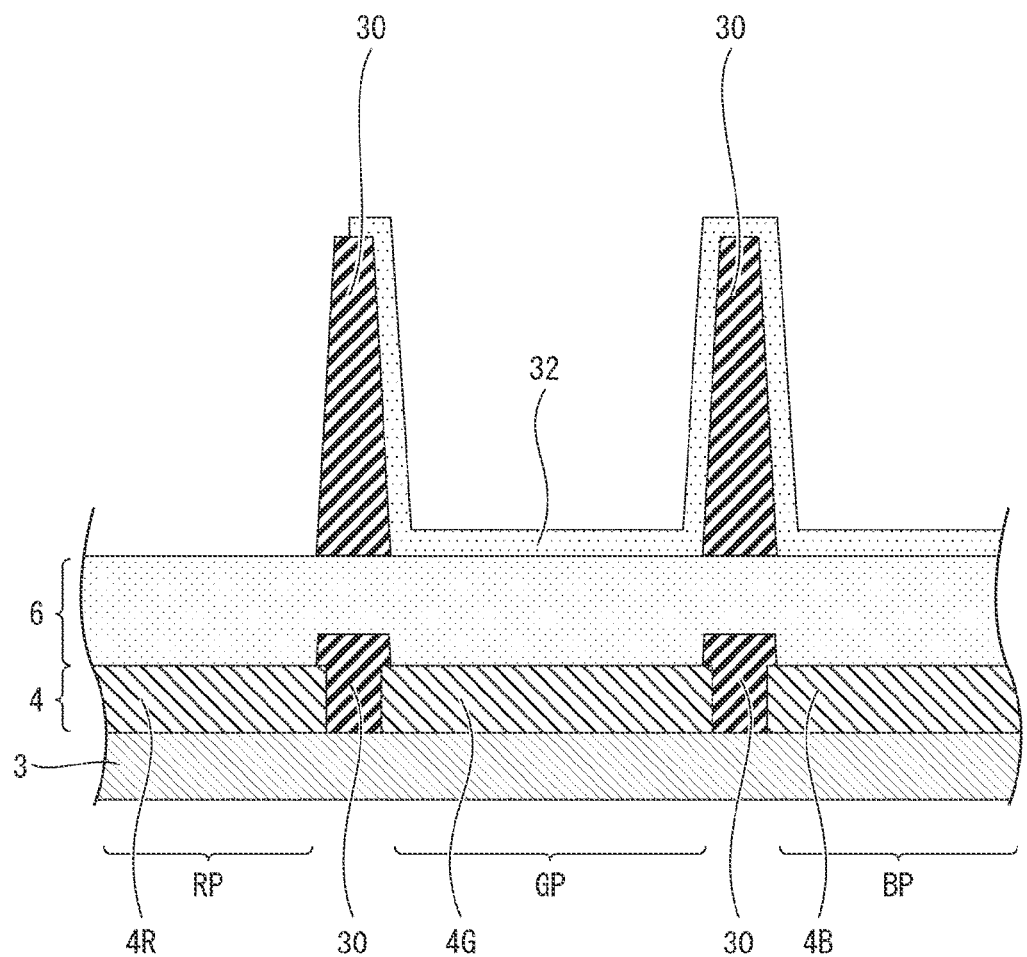
FIG. 8 illustrates, in a sectional view, another process step in the method for manufacturing the light-emitting device according to the second embodiment of the disclosure.

The step of forming the light-emitting layer 8 includes firstly forming a liftoff resist 32 (Step S22) through patterning, as illustrated in FIG. 7 and FIG. 8. The liftoff resist 32 is a resin material for instance that has photosensitivity, and that contains a positive photosensitive material for instance in this embodiment. In Step S22, the liftoff resist 32 is formed in the form of a film in common in a plurality of subpixels and then undergoes exposure and development to be thus patterned in a location excluding where the red light-emitting layer 8R is to be formed.

For instance, Step S22 includes firstly forming the liftoff resist 32 over the hole transport layer 6 and the banks 30 on the hole transport layer 6 through application or other methods, as illustrated in FIG. 7. The next is placing a photo mask M in a location above the liftoff resist 32 overlapping the green subpixel GP and blue subpixel BP except the red subpixel RP, as illustrated in FIG. 7.

In this state, light irradiation from above the liftoff resist 32 is performed, as illustrated in FIG. 7, and thus, only the liftoff resist 32 formed in the location overlapping the red subpixel RP is irradiated with light. This improves the solubility of the liftoff resist 32 formed in the location overlapping the red subpixel RP with respect to a developing solution. The next is developing the liftoff resist 32 with a proper developing solution to thus pattern the liftoff resist 32 in the location overlapping the green subpixel GP and blue subpixel BP except the red subpixel RP, as illustrated in FIG. 8. It is noted that the liftoff resist 32 formed through application may undergo pre-baking before being pattered.

Figure 9:
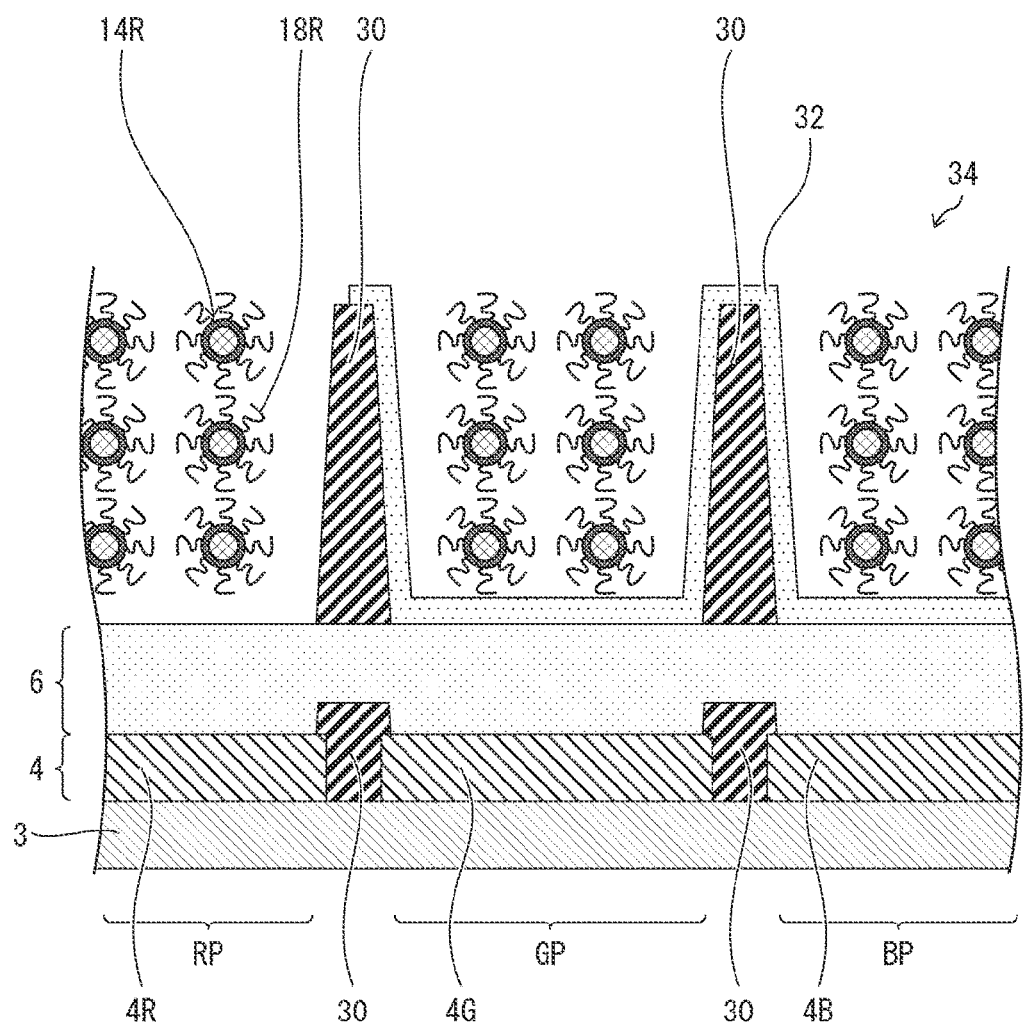
FIG. 9 illustrates, in a sectional view, another process step in the method for manufacturing the light-emitting device according to the second embodiment of the disclosure.

The next is performing foregoing Step S8 to apply a quantum dot solution with quantum dots dispersed, to form a quantum dot layer, as illustrated in FIG. 9. FIG. 9 illustrates applying a quantum dot solution with the red quantum dots 14R dispersed, to form a quantum dot layer 34.

Figure 10:
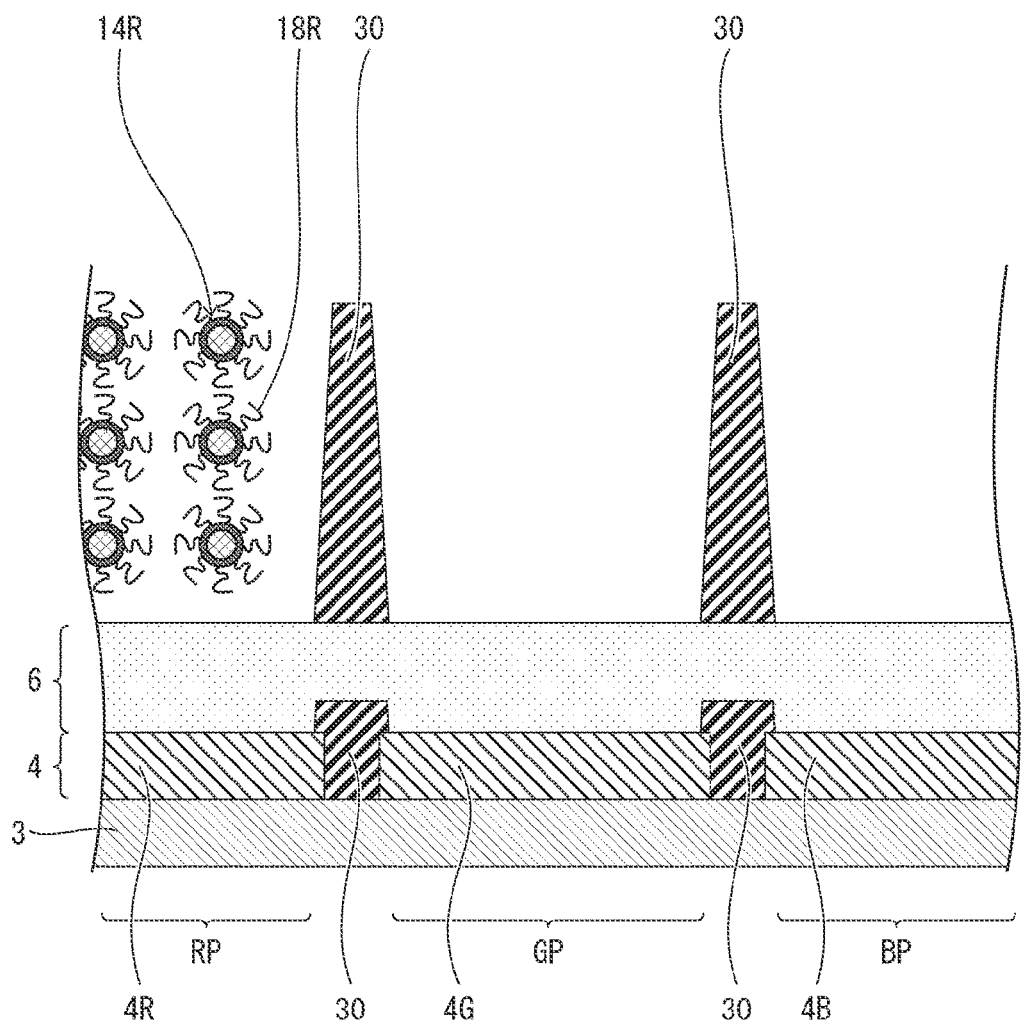
FIG. 10 illustrates, in a sectional view, another process step in the method for manufacturing the light-emitting device according to the second embodiment of the disclosure.

The next (Step S24) is patterning the quantum dot layer by removing part of the formed quantum dot layer through a liftoff method. For instance, Step S24 includes removing the liftoff resist 32 patterned in Step S22 by using a proper solvent containing a material, such as acetone. This removes the liftoff resist 32 formed in the location overlapping the green subpixel GP and blue subpixel BP. Here, the liftoff resist 32 is removed, and the quantum dot layer 34 formed on the liftoff resist 32 is also removed. Accordingly, the red quantum dots 14R remain in only the red subpixel RP, as illustrated in FIG. 10.

After that is performing Step S22, Step S8, and Step S24 repeatedly while changing the kind of quantum dots contained in the quantum dot solution that is applied in Step S8, and changing the location for forming the photo mask M in Step S22. This forms a quantum dot layer that includes the red quantum dots 14R, a quantum dot layer that includes the green quantum dots 14G, and a quantum dot layer that includes the blue quantum dots14B.

The next is performing Step S10 through Step S16 sequentially to form the mixed crystalline body 16R, the mixed crystalline body 16G, and the mixed crystalline body 16B. This forms the red light-emitting layer 8R, green light-emitting layer 8G, and blue light-emitting layer 8B according to this embodiment.

Here, the mixed crystalline body 16R, the mixed crystalline body 16G, and the mixed crystalline body 16B, when having the same composition, may be formed at one time in the same process step. Further, the mixed crystalline body 16R, the mixed crystalline body 16G, and the mixed crystalline body 16B may be formed in individual process steps when some of the mixed crystalline body 16R, mixed crystalline body 16G and mixed crystalline body 16B have compositions different from each other. For instance, some of the mixed crystalline body 16R, mixed crystalline body 16G and mixed crystalline body 16B may contain ZnS, and the other(s) may contain ZnSe.

For instance, only the red light-emitting layer 8R can be formed by forming, in Step S10 after patterning the red quantum dot 14R, the mask 24 in a location including the green subpixel GP and blue subpixel BP, and by performing Step S12. Repeating these process steps while changing the solute of a reaction solution can form the light-emitting layer 8 in which the mixed crystalline body 16R, the mixed crystalline body 16G, and the mixed crystalline body 16B have mutually different compositions.

The next is performing Step S18 and Step S20 sequentially to form the electron transport layer 10 and the cathode 12. The light-emitting element 2 according to this embodiment is formed through the foregoing, and the process steps for manufacturing the light-emitting device 1 are completed.

The light-emitting element 2 according to this embodiment as well includes, in the light-emitting layer 8, the plurality of quantum dots 14, and the mixed crystalline body 16 containing at least one of ZnS or ZnSe. The light-emitting element 2 according to this embodiment consequently improves the light emission efficiency and reliability of the light-emitting device 1 including the light-emitting element 2. Further, the light-emitting device 1 according to this embodiment includes the red subpixel RP, the green subpixel GP, and the blue subpixel BP. The light-emitting device 1 according to this embodiment thus enables color light emission by driving the light-emitting element within each subpixel individually.

Further in this embodiment, the compositions of the mixed crystalline body 16R, mixed crystalline body 16G and mixed crystalline body 16B can be changed for each subpixel, in accordance with the compositions of the shells 14S of the respective red quantum dot 14R, green quantum dot 14G and blue quantum dot 14B. The light-emitting element 2 according to this embodiment can consequently improve the efficiency of carrier injection from the mixed crystalline body 16R into the red quantum dots 14R, the efficiency of carrier injection from the mixed crystalline body 16G into the green quantum dots 14G, and the efficiency of carrier injection from the mixed crystalline body 16B into the blue quantum dots 14B.

Third Embodiment

Another Example of Manufacturing Method

Figure 11:
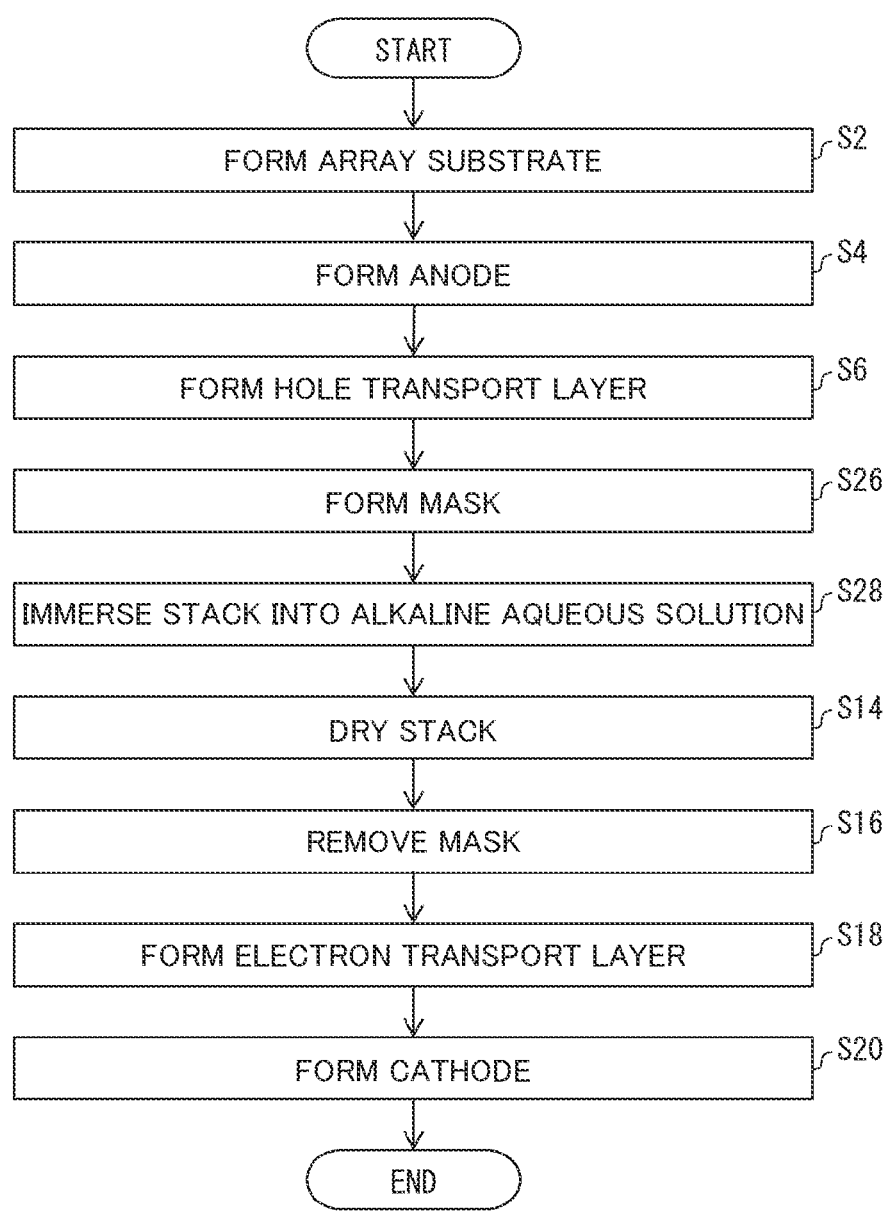
FIG. 11 is a flowchart showing a method for manufacturing a light-emitting device according to a third embodiment of the disclosure.

The light-emitting device 1 according to this embodiment has the same configuration as the light-emitting device 1 according to the first embodiment. In this embodiment, only the method of forming the light-emitting layer 8 of the light-emitting element 2, included in the method for manufacturing the light-emitting device 1, is different from the method of forming the light-emitting layer 8 according to the first embodiment. A method for manufacturing the light-emitting device 1 according to this embodiment will be described with reference to FIG. 11. FIG. 11 is a flowchart showing the method for manufacturing the light-emitting device 1 according to this embodiment.

The method for manufacturing the light-emitting device 1 according to this embodiment includes firstly forming the array substrate 3, the anode 4, and the hole transport layer 6 through the same process steps as Step S2 through Step S6 in the first embodiment.

The next in this embodiment is forming a quantum dot layer including the quantum dots 14, together with forming the mixed crystalline body 16 to form the light-emitting layer 8. The step of forming the light-emitting layer 8 will be further detailed with reference to FIG. 12 as well as FIG. 11.

Figure 12:
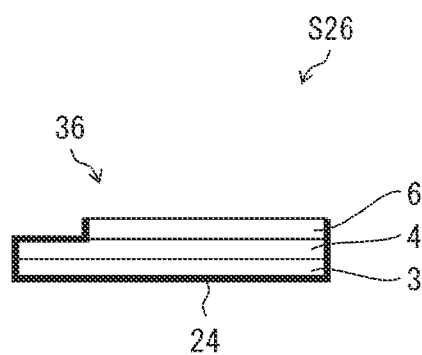
FIG. 12 illustrates, in a sectional view, a part of a step of forming a light-emitting layer in the method for manufacturing the light-emitting device according to the third embodiment of the disclosure.
Figure 12:
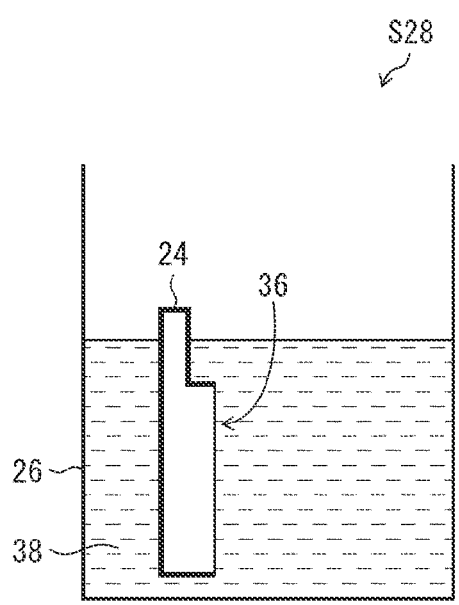

The step of forming the light-emitting layer 8 in this embodiment includes firstly forming the mask 24 (Step S26) onto a stack 36 including the array substrate 3, anode 4 and hole transport layer 6, as illustrated in FIG. 12. The mask 24 used in Step S26 may have the same configuration as the mask 24 used in foregoing Step S10. Here in Step S26, the mask 24 is formed onto the side surface of each layer of the stack 36 and the lower surface of the array substrate 3. Accordingly, only a part of the outer surface of the stack 36 including the upper surface of the hole transport layer 6 is exposed from the mask 24.

The next (Step S28) is immersing the stack 36 with a part of its outer surface including the upper surface of the hole transport layer 6 being exposed into a reaction solution 38 within the reaction container 26. The reaction solution 38 includes an alkaline aqueous solution containing the same material as the foregoing reaction solution 28. However, the quantum dots 14 are further dispersed in the reaction solution 38 in this embodiment. Further, the ligands 18 may be further dispersed in the reaction solution 38 or may coordinate with the quantum dots 14 dispersed in the reaction solution 38.

Thus, the crystal of the mixed crystalline body 16 is grown through CBD in Step S28, with the quantum dots 14 dispersed in the reaction solution 38 getting involved. Hence, the light-emitting layer 8 including the quantum dots 14 embedded in the mixed crystalline body 16 is formed at one time together with the formation of the mixed crystalline body 16.

The next is drying the stack 36 with the light-emitting layer 8 formed, removing the mask 24 from the stack 36, and forming the electron transport layer 10 and the cathode 12 through the same process steps as Step S14 through Step S20 in the first embodiment. This forms the light-emitting element 2 according to this embodiment, and the process steps for manufacturing the light-emitting device 1 are completed.

The light-emitting element 2 according to this embodiment as well includes, in the light-emitting layer 8, the plurality of quantum dots 14, and the mixed crystalline body 16 containing at least one of ZnS or ZnSe. The light-emitting element 2 according to this embodiment consequently improves the light emission efficiency and reliability of the light-emitting device 1 including the light-emitting element 2. Further, the method for manufacturing the light-emitting device 1 according to this embodiment includes the step of forming the light-emitting layer 8, in which the light-emitting layer 8 including the quantum dots 14 and mixed crystalline body 16 can be formed at one time through the crystal growth in the mixed crystalline body 16. The method for manufacturing the light-emitting device 1 according to this embodiment thus eliminates the need for, but not limited to, a step of applying a solution with the quantum dots 14 dispersed, thus simplifying the manufacturing process steps.

It is noted that the method of forming the light-emitting layer 8 according to this embodiment is applicable to the method of forming the light-emitting layer 8 of the light-emitting element 2 according to the foregoing embodiment. For instance, only the red light-emitting layer 8R can be formed by forming, in Step S26, the mask 24 in a location including the green subpixel GP and blue subpixel BP, and by performing Step S28. After that is performing Step S26 and Step S28 repeatedly while changing the location for forming the mask 24 in Step S26, and changing the kind of the reaction solution in Step S28. This enables the red light-emitting layer 8R, green light-emitting layer 8G, and blue light-emitting layer 8B to be formed through the method of forming the light-emitting layer 8 according to this embodiment.

The disclosure is not limited to the foregoing embodiments. Various modifications can be devised within the scope of the claims. An embodiment that is obtained in combination, as appropriate, with the technical means disclosed in the respective embodiments is also included in the technical scope of the disclosure. Furthermore, combining the technical means disclosed in the respective embodiments can form a new technical feature.

REFERENCE SIGNS LIST

1 light-emitting device
2 light-emitting element
4 anode (first electrode)
6 hole transport layer (first carrier transport layer)
8 light-emitting layer
10 electron transport layer (second carrier transport layer)
12 cathode (second electrode)
14 quantum dot
16 mixed crystalline body
18 ligand

The invention claimed is:

1. A light-emitting element comprising:
a first electrode and a second electrode; and
a light-emitting layer disposed between the first electrode and the second electrode,
wherein the light-emitting layer includes a plurality of quantum dots, and a mixed crystalline body containing at least one of ZnS or ZnSe or containing $Zn(OH)_2$.

2. The light-emitting element according to claim 1, wherein each of the plurality of quantum dots includes a core and a shell covering the core.

3. The light-emitting element according to claim 2, wherein the shell contains $ZnS_xSe_{1-x}$, where $0 \leq x \leq 1$ is satisfied.

4. The light-emitting element according to claim 1, wherein the light-emitting layer further includes a ligand.

5. The light-emitting element according to claim 1, wherein a molar concentration of the at least one of ZnS or ZnSe in the light-emitting layer is higher than a molar concentration of $Zn(OH)_2$.

6. The light-emitting element according to claim 1, wherein the mixed crystalline body further contains ZnO.

7. A method for manufacturing a light-emitting element, the method comprising:
forming a first electrode; and
forming a light-emitting layer by using:
a plurality of quantum dots, and
an alkaline aqueous solution containing at least one of a zinc source or a selenium source, and containing a sulfur source.

8. The method according to claim 7, further comprising forming a first carrier transport layer onto the first electrode,
wherein forming the light-emitting layer includes immersing, into the alkaline aqueous solution, a quantum dot layer formed on the first carrier transport layer by using a quantum dot solution containing the plurality of quantum dots.

9. The method according to claim 8, wherein the quantum dot solution contains a ligand coordinating with each of the plurality of quantum dots.

10. The method according to claim 8, further comprising replacing a solvent of the quantum dot solution one or more times before using the quantum dot solution.

11. The method according to claim 7, further comprising forming a first carrier transport layer onto the first electrode,
wherein forming the light-emitting layer includes dispersing the plurality of quantum dots into the alkaline aqueous solution, and immersing the first carrier transport layer into the alkaline aqueous solution with the plurality of dispersed quantum dots.

12. The method according to claim 7, wherein the zinc source includes at least one of zincate, zinc sulfate, zinc nitrate, or zinc acetate.

13. The method according to claim 7, wherein the sulfur source includes at least one of sulfur, water-soluble thiol, water-soluble thiourea, or a water-soluble thiocarbonyl compound.

* * * * *